United States Patent [19]

Fladstol

[11] Patent Number: 4,763,067
[45] Date of Patent: Aug. 9, 1988

[54] OSCILLOSCOPE HAVING A DISPLAYED TRIGGER INDICATOR
[75] Inventor: Gary R. Fladstol, Portland, Oreg.
[73] Assignee: Tektronix, Inc., Beaverton, Oreg.
[21] Appl. No.: 107,220
[22] Filed: Oct. 8, 1987
[51] Int. Cl.⁴ .................... G01R 13/20; G01R 15/08; G09G 3/00
[52] U.S. Cl. ................... 324/121 R; 324/96; 324/115; 340/754
[58] Field of Search ........... 324/121 R, 115, 96, 324/122; 340/722, 752, 753, 754; 315/377; 364/487

[56] References Cited
U.S. PATENT DOCUMENTS
4,072,851  2/1978  Rose ........................... 364/487
4,593,242  6/1986  Bristol et al. ................. 324/121 R

*Primary Examiner*—Ernest F. Karlsen
*Attorney, Agent, or Firm*—George T. Noe

[57] ABSTRACT

An oscilloscope having a displayed trigger indicator is provided in which triggering level, slope, and source information on displayed directly on the viewing screen adjacent corresponding waveforms. In a preferred embodiment, a vertical bar represents the triggering level range, and a marker or dot is superimposed thereon to indicate the trigger level. Slope polarity is also indicated, as is triggering source. These indicators permit the triggering point to be quickly selected and set while viewing them in relationship to corresponding waveforms, and are always on screen for convenient reference and waveform photography.

3 Claims, 2 Drawing Sheets

OSCILLOSCOPE HAVING A DISPLAYED TRIGGER INDICATOR

BACKGROUND OF THE INVENTION

The present invention relates generally to oscilloscope displays, and in particular to an oscilloscope display showing trigger level, slope, and source information.

In both analog and digital oscilloscopes, there is a trend to take advantage of the processing power of microprocessors to provide more instrument features and performance capabilities, as well as to reduce the complexity of operation from a user standpoint. Some of these newer oscilloscopes permit operating modes and display parameters to be selected in conjunction with processor-driven menus displayed directly on the oscilloscope's viewing screen. Selection keys may be placed adjacent the screen, or touch screens may be used, substantially reducing the number of knobs traditionally found on oscilloscopes.

While some of the newer oscilloscopes have microprocessor controlled peak-to-peak automatic triggering, there are still times when it would be more convenient to manually select and adjust triggering. Concomitant with selection and adjustment, it would be desirable to know the precise triggering level, slope, and source.

SUMMARY OF THE INVENTION

In accordance with the present invention, an oscilloscope is provided with a displayed trigger indicator.

In the preferred embodiment, the triggering information is displayed directly on the viewing screen along with waveforms. The triggering level control range is displayed as a bar or scale line the length of which is proportional to the amplitude range of a corresponding waveform, with the trigger level being displayed as a marker at its relative position along the range indicator, and preferably in alignment with the point on the waveform at which triggering actually occurs. Triggering slope, which represents whether a trigger pulse is generated on a positive-going or a negative-going portion, may be indicated in a number of ways, including polarity symbols, level range indicators with reverse images, arrow heads, sloped line segments, etc. Source may be indicated by alphanumeric characters or symbols.

It is therefore a feature of the present invention to provide a display of triggering information in an oscilloscope.

It is another feature of the present invention to display triggering information directly on the viewing screen of an oscilloscope along with corresponding waveforms.

Other features and attainments of the present invention will become obvious to those having ordinary skill in the art upon reading the following description when taken in conjunction with the accompanying drawings.

DETAILED DESCRIPTION OF THE INVENTION

Figure 1:
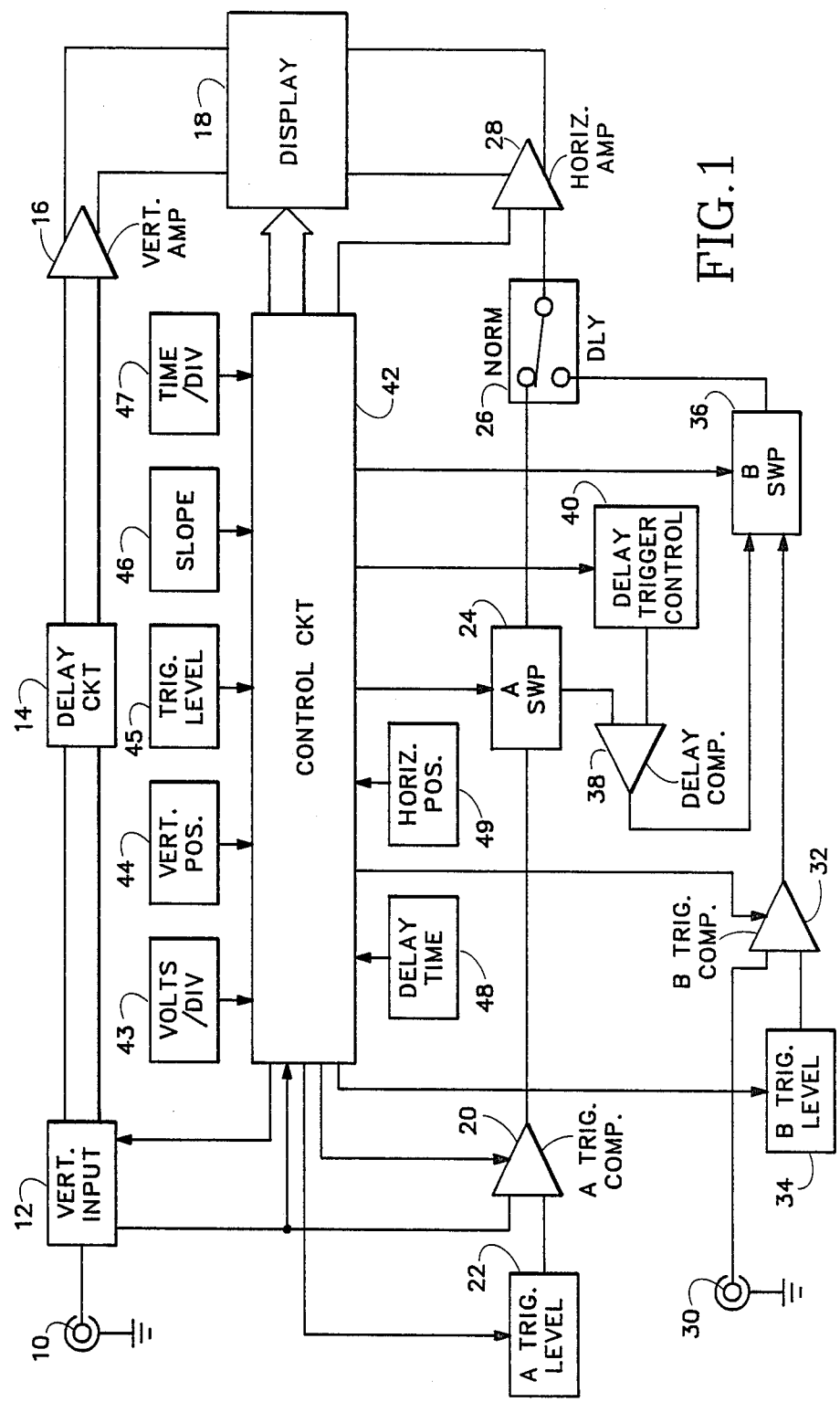
FIG. 1 is a block diagram of an oscilloscope for indicating triggering information in accordance with the present invention.

Referring the oscilloscope block diagram of Fig. 1, electrical signals to be displayed are applied to a conventional vertical processing channel comprising an input connector 10, a vertical input circuit 12, a delay circuit 14, a vertical amplifier 16, and the vertical deflection system of a display device 18. Vertical input circuit 12 comprises an input coupling circuit, an attenuator, and suitable amplification stages to condition and amplify the input signal, as well as split the signal into a push-pull or balanced differential signal for ultimately driving the vertical deflection system of the oscilloscope. Display device 18 may suitably be a cathode-ray tube (CRT).

The oscilloscope shown in the block diagram of FIG. 1 has a dual time base system with separate A and B sweep generators, and suitably may be operated in conventional normal-delayed sweep modes.

A sample of the input signal is extracted from the vertical input circuit 12 and applied to one input of an A trigger comparator 20 for comparison with a controllable reference voltage level applied to its other input from an A trigger level circuit 22. When the voltage of the input signal sample passes through the reference level, comparator 20 produces a trigger pulse which is applied to an A sweep generator circuit 24. Whether the trigger pulse is generated on a positive-going portion of the input signal, or negative-going portion, is a function of slope selection, which may be implemented in a variety of ways. For example, if the trigger pulse is defined as a positive-going transition at the output of comparator 20, then slope selection simply may be switching the input leads to the comparator. Or, an inverter could be switched into and out of the comparator output circuit by the slope selection control. Another way to implement slope selection is to condition the A sweep generator selectively to respond to either positive-going or negative-going transitions at the output of trigger comparator 20. When the A sweep generator is triggered, a linear ramp voltage of a preselected slope (sweep rate) is produced and applied via a selector switch 26 and horizontal amplifier 28 to the horizontal deflection system of the display device 18.

Similarly, for B sweep operation, a B trigger input signal is applied via an input connector 30 to one input of a B trigger comparator 32, which compares the B trigger input signal with a controllable reference level voltage from a B trigger level circuit 34 applied to its other input, and generates a trigger pulse in accordance with a selected slope as described hereinabove for the A sweep. The B trigger pulse, then, is applied to a B sweep generator 36 to initiate a linear ramp voltage of selected slope. Also applied to the B sweep generator 36 is a delay trigger pulse from delay trigger comparator 38 in response to a comparison of the A sweep ramp signal with a controllable reference level from a delay time control circuit 40, which allows any point along the A sweep to be selected as the delay triggering point.

A microprocessor based control circuit 42 provides control of the various subcircuits and orchestrates operation of the oscilloscope in response control settings or parameter selections by the user. Coupled to the control circuit 42 are front panel controls 43-49, which may be in the form of knobs and switches in the conventional manner, or may be soft keys to be read by the microprocessor within control circuit 42 in response to pushbutton or touch-screen menu selection. For this discussion, VOLTS/DIV control 43 selects vertical deflection sensitivity, VERT POS control 44 establishes the vertical position, and the microprocessor of control circuit 42, in response to these settings, sets up the appropriate attenuation, gain, and DC level in the vertical channel. The control circuit 42 produces A and B trigger control levels for the A and B trigger level circuits 22 and 34, depending on the setting of the TRIG LEVEL control 45. SLOPE control switch 46 selects either positive (+) or negative (−) slope for both A and B trigger comparators 20 and 32. Also produced by the control circuit 42, in response to TIME/DIV control 47, are A and B sweep rate control signals to establish the appropriate sweep rates for the A and B sweep generators 24 and 36. The delay time control circuit 40 receives a delay time control signal from the control circuit 42, depending on the setting of DEALY TIME control 48. Finally, the horizontal amplifier 28 receives a horizontal position control signal from the control circuit 42 in response to the setting of the HORIZ POS control 49 to establish the horizontal position of the display.

Also generated by the control circuit 42 is parameter setting data to be supplied to the display device 18 in order to display parameter information as described in detail below. It should be noted that for simplification of the front panel of the oscilloscope, a common control knob may be used the vertical position control 44, horizontal position control 49, and trigger level control 45. Also, a single rotary encoder may be used for both the VOLTS/DIV and TIME/DIV controls 43 and 47.

Figure 2:
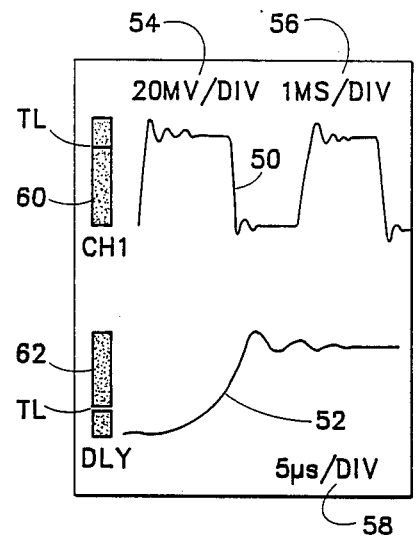
FIG. 2 shows an example of a viewing screen in which triggering information is displayed along with corresponding waveforms.

FIG. 2 shows an example of a typical viewing-screen display in accordance with the present invention. A typical pulse waveform 50 is displayed on the A sweep and a magnified waveform 52 representing a portion of the waveform 50 selected by the delay time control is displayed on the B (delayed) sweep. The magnification ratio of the two waveforms 50 and 52 is determined by the ratio of the A and B sweep rates. Displayed near the edges of the viewing screen are the selected vertical deflection sensitivity (e.g., 20 mV/DIV), A sweep rate (e.g., 1 mS/DIV), and B sweep rate (e.g., 5 uS/DIV), all in alphanumeric form. At the left edge of the screen and located adjacent the two waveforms 50 and 52 displayed on the A and B sweeps, respectively, are two trigger indicators 60 and 62. These trigger indicators are in the form of vertical bars, the length of which corresponds with the amplitude windows for each of the two displays, and are in the same vertical scale so that trigger level markers TL on each bar correspond precisely to the vertical position of the point on the waveform where triggering takes place. The length bar 60 represents the trigger level control range, which may be established by either fixed reference voltages or by measuring the peak-to-peak values of incoming signals to set a corresponding level control range, and marker TL can be moved up and down the bar by adjusting the TRIG LEVEL control 45 to select the triggering point. The length of bar 62 in this example represents the length of the A sweep and is calculated by the microprocessor, and the marker TL can be moved up and down the bar by adjusting the DELAY TIME control 48. Since the waveforms can be positioned vertically, or only one waveform displayed rather than two, the microprocessor in the control circuit 42 reads the control settings to determine which channels are to be displayed and what the deflection sensitivity and vertical positions are, then calculates the length and vertical position of the trigger indicators 60 and 62, and places the markers TL accordingly.

To facilitate trigger slope indication, as selected as described hereinabove, several techniques may be employed. As shown in FIG. 2, for positive slope, marker TL can be intensified as shown on indicator 60, and for negative slope, marker TL can be of reduced intensity (and so may appear as a gap) as shown on indicator 62. Intensity modulating and beam blanking are well-known capabilities of oscilloscopes, and may be exploited here to indicate slope.

The selected source of the triggering signals may be displayed in alphanumeric form near the trigger indicators.

Note that for the example shown in FIG. 2, CH1 is displayed adjacent trigger indicator 60 and DLY is displayed adjacent trigger indicator 62 to indicate that the triggering source for the waveform 50 display on the A sweep is Channel 1, and that the triggering source for the waveform 52 display on the B sweep is the delayed trigger point selected along the A sweep. Other trigger sources, such as LINE, EXTernal, or other vertical channels (CH2, CH3, etc.) may be easily generated and displayed as well.

Figures 3A, 3B:
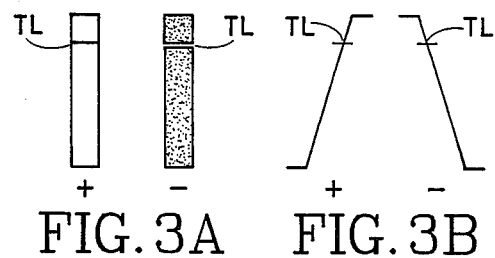
FIGS. 3A through 3D show various ways in which triggering information may be indicated.
Figures 3C, 3D:
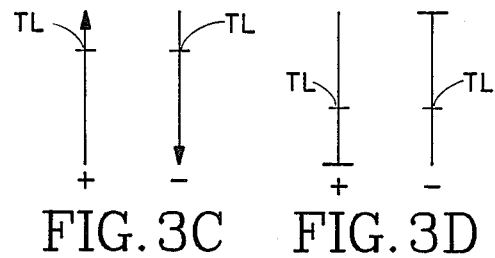

FIGS. 3A-3D show some alternative methods of displaying trigger indicators. In FIG. 3A, the positive-slope indicator is represented by a hollow rectangle with a horizontal line segment indicating triggering level TL, and the negative-slope indicator is represented by a solid rectangle with a horizontal gap indicating triggering level TL. In FIG. 3B, the indicators are represented by appropriately sloped line segments to indicate positive and negative slopes, with the triggering level TL appearing as hash marks. The TL markers could be intensified dots as well, and could be blinking as well as constant intensity dots. In FIG. 3C, the indicators are represented by vertical lines with arrows indicating the slope, and again the triggering levels TL are indicated by suitable markers. In FIG. 3D, the indicators are represented by vertical lines, with a horizontal base line located at one end to indicate triggering on positive-going or negative-going transitions. Again, suitable TL markers may be provided.

It can be discerned from the foregoing description that an oscilloscope is provided with one or more trigger indicators, depending on the number of waveform displays, with such trigger indicators located adjacent respective corresponding waveforms to indicate triggering level and slope. With some of the more basic oscilloscope parameters such as deflection sensitivity indicated directly on the viewing screen, a user can focus attention on the screen at all times in setting up an optimum, triggered display. Moreover, trigger information may be shown in any photograph taken of the display.

As can be readily understood by those having ordinary skill in the art, many modifications and changes may be made without departing from the invention in its broader aspects.

What I claim as being novel is:

1. In an oscilloscope having at least one vertical channel for processing electrical signals, at least one sweep generator for providing sweep signals, and a display device having a viewing screen and being responsive to said electrical signals and said sweep signals for displaying waveforms representing said electrical signals, a method of indicating trigger control settings, comprising:
  generating a trigger level control range indicator having a vertical linear dimension corresponding to the overall range of a trigger level control and scaled proportionately with the amplitude of a displayed waveform;
  generating a trigger level marker; and
  displaying said trigger level range indicator on said viewing screen adjacent said displayed waveform wherein said trigger level marker is superimposed on said trigger level range indicator.

2. A method in accordance with claim 1 further comprising the steps of generating a trigger slope indicator and displaying said trigger slope indicator in conjunction with said trigger level range indicator.

3. A method in accordance with claim 1 further comprising the steps of generating a trigger source indicator and displaying said trigger source indicator adjacent said trigger level range indicator.

* * * * *